United States Patent [19]

Bergman et al.

[11] Patent Number: 4,622,452

[45] Date of Patent: Nov. 11, 1986

[54] ELECTRIC ARC VAPOR DEPOSITION ELECTRODE APPARATUS

[75] Inventors: Clark Bergman, Roseville; Gary E. Vergason, Minneapolis, both of Minn.

[73] Assignee: Multi-Arc Vacuum Systems, Inc., St. Paul, Minn.

[21] Appl. No.: 515,568

[22] Filed: Jul. 21, 1983

[51] Int. Cl.[4] .............................................. B23K 9/00
[52] U.S. Cl. ......................... 219/121 PR; 219/121 PS; 219/121 PM; 427/37
[58] Field of Search ................ 219/121 PR, 121 PY, 219/121 PM, 121 PS; 118/50.1, 503, 500, 715, 726, 624; 427/37, 34, 196, 52, 124; 204/192 E, 192 R, 192 EC, 298

[56] References Cited

U.S. PATENT DOCUMENTS

| | | | |
|---|---|---|---|
| 898,346 | 9/1908 | Ferranti . | |
| 2,378,476 | 6/1945 | Guellich | 91/12.2 |
| 3,294,669 | 12/1966 | Theuerer | 204/298 |
| 3,369,989 | 2/1968 | Kay et al. | 204/298 |
| 3,604,970 | 9/1971 | Culbertson et al. | 313/107 |
| 3,625,848 | 12/1971 | Snaper | 204/192 |
| 3,691,053 | 9/1972 | James et al. | 204/298 |
| 3,709,809 | 1/1973 | Wright et al. | 204/192 |
| 3,783,231 | 1/1974 | Sablev et al. | 219/123 |
| 3,793,179 | 2/1974 | Sablev et al. | 204/298 |
| 4,094,764 | 6/1978 | Boucher et al. | 204/298 |
| 4,197,175 | 4/1980 | Moll et al. | 204/192 R |
| 4,222,838 | 9/1980 | Bhagat et al. | 204/192 E |
| 4,410,407 | 10/1983 | Macaulay | 204/192 EC |
| 4,448,799 | 5/1984 | Bergman et al. | 427/37 |
| 4,466,872 | 8/1984 | Einbinder | 204/192 R |

FOREIGN PATENT DOCUMENTS

| | | |
|---|---|---|
| 284883 | 7/1976 | U.S.S.R. . |
| 359977 | 7/1976 | U.S.S.R. . |
| 367755 | 7/1976 | U.S.S.R. . |

*Primary Examiner*—Clarence L. Albritton
*Assistant Examiner*—M. M. Lateef
*Attorney, Agent, or Firm*—Merchant, Gould, Smith, Edell, Welter & Schmidt

[57] ABSTRACT

An electrode apparatus for an electric arc vapor deposition machine has an electrode body with a coaxially aligned stud threaded into its rear surface and projecting substantially perpendicularly thereto. The distal end of the stud is threaded for rapid detachable fastening to an electrode support means such that the periphery of the rear surface of the electrode is uniformly drawn toward engagement with the electrode support means. A seal member forms a fluid tight seal between the peripheral rear surface of the electrode body and the electrode support means, which cooperatively define a coolant cavity for actively and efficiently cooling substantially the entire lower surface of the electrode. The electrode support means includes means for directly bathing the seal with liquid coolant from the coolant cavity. The simple threaded stud mounting configuration allows a spent cathode to be rapidly replaced.

25 Claims, 4 Drawing Figures

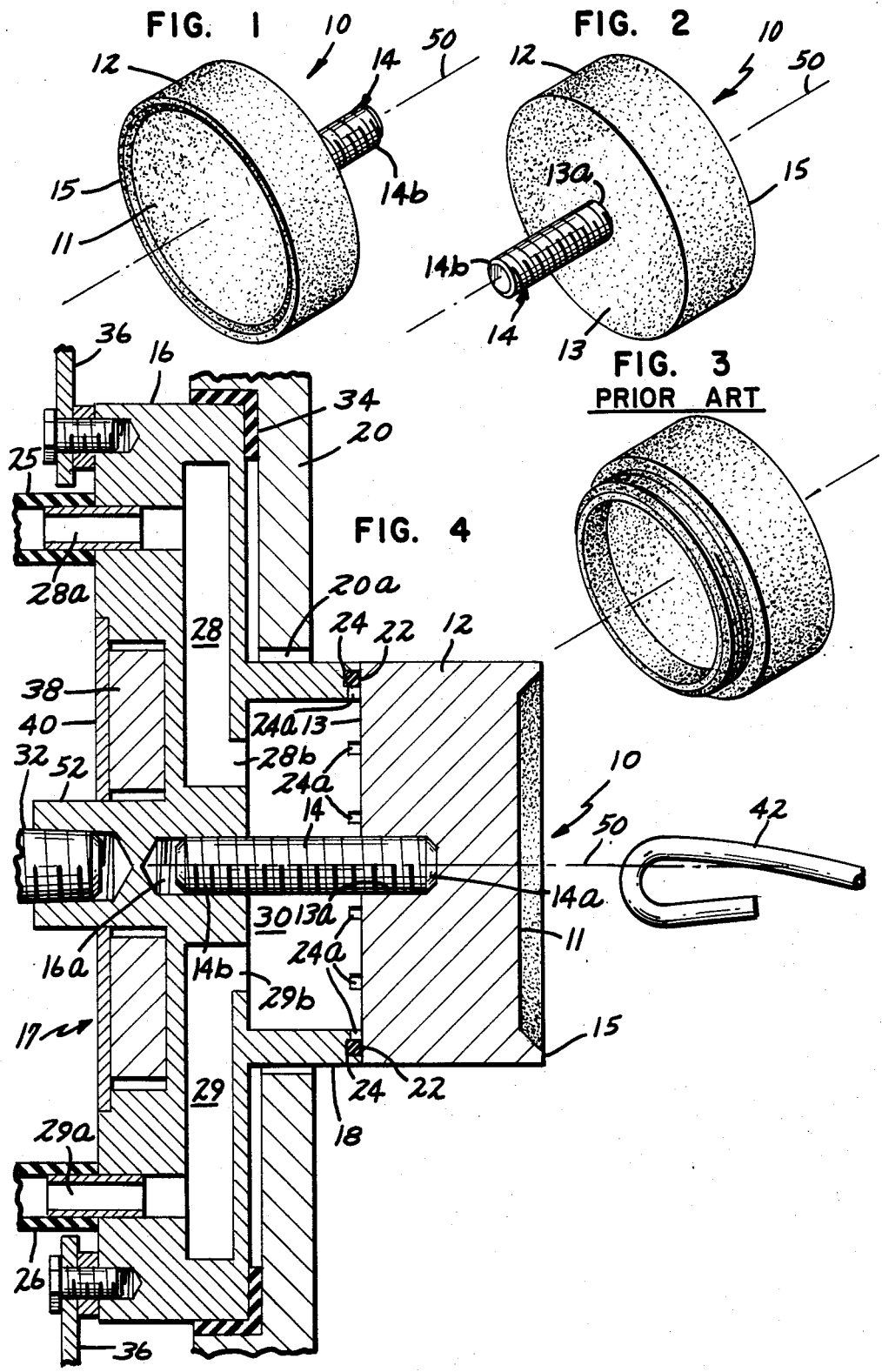

ELECTRIC ARC VAPOR DEPOSITION ELECTRODE APPARATUS

FIELD OF THE INVENTION

This invention relates generally to electric arc vapor deposition machines, and more particularly to a coating source material electrode for an electric arc vapor deposition chamber.

BACKGROUND OF THE INVENTION

Processes for depositing thin films of various materials on substrates are well known and have been found to be very useful. The processes can be broadly classified into two categories: physical vapor deposition and chemical vapor deposition. As used herein, chemical vapor deposition refers to that coating art wherein a plurality of reactive components are introduced into a coating chamber. The components are caused to chemically react with one another, and the products of the reaction form the film that is coated upon the substrate. Chemical vapor deposition processes can be conducted at various pressures and temperatures.

As used herein, the term physical vapor deposition refers to that coating art wherein at least one of the coating components is initially placed into the coating chamber in a non-gaseous form. The non-gaseous coating component is generally called the "source." Sufficient energy is applied to the source material to change it to its vapor state, which vapor subsequently comes to rest in film form on the substrate, perhaps after combining with other components.

There are a number of different physical vapor deposition techniques, which are distinguished in the manner in which the source material is vaporized. One physical vapor deposition technique involves heating the source material in a crucible. The crucible is heated until the contained source material melts and then vaporizes. A related technique involves passing electric current directly through the source material so that the source melts and then vaporizes due to Joule heating. In the latter process, the electrical energy is physically conducted to the source through a metallic conductor, and an arc is not generally created.

Physical vapor deposition also includes ionic bombardment and sputtering deposition techniques. With these techniques, the source material is disposed within the coating chamber as a target and is bombarded with accelerated ions. The bombarding ions impart sufficient energy to the source target material to vaporize it.

Still another type of physical vapor deposition technique, and the one to which this invention pertains, is electric arc vapor deposition. Here, as opposed to the induction Joule heating process described above, an arc is intentionally struck, and the electrical energy contained in the arc is controlled, to vaporize the source material, thus creating a coating plasma. The source material is biased at one electric potential within the coating chamber and acts as one electrode (usually the "cathode") of the electric arc discharge circuit. Another portion of the deposition chamber is biased at a second potential, different from the source potential, and acts as the second electrode (usually the "anode") of the electric arc discharge circuit. An arc-initiating trigger element is positioned proximate to the cathode source and is positively biased with respect to the cathode. The trigger element is momentarily allowed to engage the surface of the cathode material, establishing a current flow path through the trigger and cathode. As the trigger element is removed from engagement with the cathode source, an electrical arc is struck, which is thereafter maintained between the cathode and the anode electrodes of the chamber. In fact, a plurality of such arcs are typically maintained between the two electrodes in an operative electric arc vapor deposition chamber. This electric arc vapor deposition phenomenon is well known, and need not herein be discussed in detail. The electric arc(s) energy is sufficient to vaporize the source material, forming a coating plasma for subsequent deposition onto substrates within the deposition chamber.

One type of coating source material that is often used for the cathode of electric arc vapor deposition machines is titanium (Ti). When a Ti source material is used, a reactive gas such as nitrogen (N) is often introduced into the deposition chamber during the vaporization of the Ti source. The nitrogen gas reacts with the Ti. Thus, the coating plasma within the chamber comprises Ti, $N_2$, and TiN. TiN forms a gold-colored coating that has been found to be a very durable coating for cutting tools and the like.

The design of the cathode source is critical to an electric arc vapor deposition apparatus. Such cathodes are typically of solid construction, made entirely of the source material to be vaporized and coated upon the substrate. Since the cathode is a consumable/disposable item, its design must be simple and cost effective, maximizing consumable use of the cathode material. Since the cathode is subjected to extremely high temperatures and temperature gradients during a coating run, it must be of a design that will not warp out of shape and be reliably and easily replaceable when spent. Due to the high temperatures involved in the deposition process, the cathode must interface with cooling systems that communicate with the environment external of the deposition chamber. The cathode must cooperatively mate with such cooling systems in a manner so as to reliably maintain the vacuum seal of the deposition chamber and so as to avoid contamination of the coating chamber by the cooling system.

A number of such cathode source material configurations are known in the electric arc vapor deposition art. One such prior art cathode design is illustrated in FIG. 3. Such a cathode is typically constructed of solid titanium, and is turned and threaded from a solid piece of titanium stock material to produce the configuration illustrated in FIG. 3. The cathode is externally threaded adjacent to its rear surface for engaging mating threads of a cathode holder which is in turn supported by the chamber wall of a vapor deposition chamber. A sealing member, generally in the form of an O-ring, peripherally engages the rear annular surface of the cathode to form a seal for the liquid coolant which engages the rear surface of the cathode.

Generally, such prior art cathode construction functions reasonably well. However, it suffers from several drawbacks. For one, the machining process mentioned above is quite expensive and time-consuming. Further, a considerable amount of titanium, which is relatively expensive, is wasted during the turning and threading process of the titanium stock material. Also, due to the relatively large diameter of the threaded portion of such prior art cathode, it is oftentimes difficult to loosen from the cathode holder for replacement of the cathode when the source material thereof needs replenishing.

That is, after several "runs" of the electric arc deposition machine, with the cathode having experienced a series of severe thermal expansions and contractions, it has been found that prior art cathode designs such as that of FIG. 3 are difficult to unscrew from their cathode holders. Another drawback of the prior art cathode apparatus is that the cathode holder must be fairly complex, requiring female threads of relatively large radius to mate with the male threads of the cathode.

Still another shortcoming of prior art cathode structures such as that of FIG. 3, is that the liquid coolant which is placed in contact with the rear surface of the cathode during operation of the deposition machine does not typically come into direct cooling contact with the sealing O-ring which is mounted external of the cathode threads. Thus, the O-ring in such cathodes experiences high temperatures and has a tendency to prematurely age and lose its resiliency, a problem that is well known to those skilled in the art of gasket design.

The present invention is directed to the aforementioned problems. The cathode design of this invention requires less machining than its prior art counterparts, can be constructed from less stock source material, and is easier to remove from its cathode holder. A very simple cathode holder will accommodate the cathode of this invention. Also, the present design enables liquid coolant to continually directly contact the cathode holder seal, to preserve the seal life and to prevent the liquid coolant from contaminating the deposition chamber. These and other advantages of the invention will become apparent to those skilled in the art in light of the following description.

SUMMARY OF THE INVENTION

The present invention provides an improved electrode source apparatus for a physical vapor deposition machine, and in particular for an electric arc vapor deposition machine. An electrode of coating source material is configured to be centrally pulled into sealing engagement with a rear surface peripheral seal maintained in place by an electrode mounting structure. The seal forms a fluid-tight seal between the electrode and the electrode holder. The seal enables a liquid coolant to be brought into direct cooling engagement with the electrode, through the electrode mounting means. In a preferred embodiment of the invention, the seal comprises an O-ring member that is housed in an O-ring groove. The O-ring groove is designed to enable the liquid coolant to come into direct cooling contact with the O-ring seal member, to extend its operative life.

According to one embodiment of the invention there is provided an electrode configuration having a body generally disposed along a longitudinal axis and defining a front surface and a rear surface oppositely disposed to the front surface. The rear surface has a rear central portion proximate to the longitudinal axis and a periphery near the outer edge of the rear surface which is adapted to be engaged by the sealing means. Connection means are provided and operatively connect the rear central portion of the electrode body to the electrode holder of the deposition chamber. The connection means applies rearward tension to the electrode body in a direction substantially parallel to the longitudinal axis of the electrode. The rearward tension is suitable to uniformly sandwich the sealing means between the electrode periphery and the electrode mounting means for forming a fluid-tight seal therebetween.

In a preferred construction of the invention, the connector means securing the electrode body to the electrode holder comprises a simple threaded rod or stud that is threadedly engaged with the rear surface of the electrode at one end and with the electrode holder at the other. The connector stud has a diameter that is preferably significantly smaller than the outer diameter of the electrode, and is operative to axially urge the cathode periphery into cooperative sealing engagement with the seal member carried by the electrode holder.

According to a preferred configuration of the invention, the electrode holder for mounting the electrode comprises: (a) support means for cooperatively engaging the electrode along its periphery; and (b) connecting means operatively mounted to the rear central portion of the electrode for axially urging the electrode periphery into cooperative engagement with the support means. According to a preferred construction of the invention, the support means further defines a liquid coolant reservoir for carrying the liquid coolant for the electrode, and further includes means for directly cooling the seal member itself with said liquid coolant when the electrode is operatively mounted to the electrode mounting means. In a preferred embodiment of the invention, wherein the seal means comprises an O-ring seal mounted within a retaining groove, the groove includes means for communicating with the liquid coolant reservoir, to readily enable flow of the liquid coolant from the reservoir into direct cooling engagement with the seal member, thereby extending its operative life.

In a preferred construction of the electrode, as applicable to an electric arc vapor deposition machine, the electrode is configured to define a cathode of the electric arc system, and is preferably made of titanium. However, it will be understood that the principles of this invention are not limited to electric arc vapor deposition or to the use of titanium as the electrode material. While the electrode material is preferably constructed of an electrically conductive material such as a metal, the principles of this invention apply equally well to other coating source materials used for physical vapor deposition processes. Further, while a particular stud configuration will be illustrated in the specification for securing the electrode to the electrode mounting apparatus and for axially urging the electrode into peripheral cooperative engagement with the support and seal means, it will be understood that such rearward pulling on the electrode can be performed in other ways. Further, while a cylindrically shaped electrode configuration will be used in describing the preferred embodiments of the invention, it will be understood that other geometrical cathode configurations could equally well be employed within the spirit and scope of this invention. It will further be noted that while the periphery of the electrode will be described herein with reference to the actual rear surface of the electrode, that such electrode periphery need not be limited to the back surface of the electrode. These and other modifications of the invention will readily be understood by those skilled in the art.

It will readily be appreciated by those skilled in the art that the present invention provides a simple, reliable electrode construction that enables rapid simple replacement of the electrode when spent, and one which enables a uniform seal to be maintained between the electrode and its support structure in a manner that maintains the integrity of the seal itself. It will also be appreciated that the present invention enables the electrode to be readily constructed or machined from stock material with less machining than was required with prior art electrodes, and by using significantly less source material. Further, the straight-forward principles of this invention enable significant simplification of the electrode holder design. These and other advantages of the invention will become apparent to those skilled in the art upon a more detailed description of the invention.

BRIEF DESCRIPTION OF THE DRAWING

FIG. 1 is a front and side perspective view of a preferred embodiment of an electrode apparatus constructed according to the principles of the present invention.

FIG. 2 is a rear and side perspective view of the embodiment of the invention shown in FIG. 1.

FIG. 3 is a rear and side perspective view illustrating an electrode design of the prior art.

FIG. 4 is a cross-sectional view of the electrode apparatus of FIG. 1, illustrated as assembled into an electrode mounting assembly.

DETAILED DESCRIPTION OF THE INVENTION

Referring now to the Drawing wherein like reference numerals denote like elements throughout the several views, FIGS. 1 and 2 illustrate, in perspective, a preferred embodiment of an electrode 10 constructed according to the principles of this invention. The electrode 10 includes an electrode body 12 and a threaded stud 14. The electrode body 12 in the preferred embodiment is a solid piece of the coating source material to be vaporized during the electric arc deposition process and is machined from solid stock of such material to conform to the preferably disc-like shape shown in the figures. A preferred material for the cathode is titanium; however, it will be understood that other source materials could equally well be used. Since the cathode forms an electrode of an electric arc vapor deposition system, it is preferably of electricably conductive material such as metal.

The electrode body 12 includes a front surface 11 and a rear surface 13. The front surface 11 of the electrode body 12 is defined as the portion of the electrode body 12 that is most proximate to the interior of the deposition chamber when the electrode 10 is operatively mounted in the chamber, whereas the rear surface 13 of the electrode body 12 is opposite the front surface 11. This definition of "front" and "rear" will be used throughout this specification. The front surface 11 of the electrode body 12 is preferably machined so as to include a lip 15 at the peripheral front edge the electrode body 12. As is known to those skilled in the art of electric arc vapor deposition, such a lip helps to retain the cathode spot(s) created by the electric arc(s) impinging on the electrode 10, on the front surface 11 of the electrode body 12. The rear surface 13 of the electrode body 12 has an internally threaded hole 13a axially formed therein for accepting the external male threads of a first end 14a of a stud 14 (see FIG. 4). The stud 14 also has a second externally threaded end 14b. The stud 14 is preferably an electrical conductor and is in the preferred embodiment of a stainless steel alloy. In the preferred embodiment, the stud 14 is threaded along its entire length. As shown in FIG. 2, the rear surface 13 of the electrode body 12 is preferably flat and simply has the stud 14 axially extending outwardly therefrom. The electrode body 12 and the stud 14 are coaxially aligned about the longitudinal axis 50. In the preferred embodiment, the electrode body 12 is of generally cylindrical configuration, however, it will be understood that the electrode could assume other geometrical shapes.

FIG. 4 shows a cross-sectional view of the electrode 10 of FIGS. 1 and 2, illustrated as operatively mounted to an electrode holder 16. Along with other components as discussed below, the electrode 10 and holder 16 generally comprise an electrode assembly 17.

The electrode 10 is threadedly engaged with the electrode holder 16 as shown in FIG. 4. The stud end 14b is threaded into a hole 16a of the holder 16 having corresponding female threads. It will be understood that while a threaded connection between the electrode stud and the electrode holder 16 has been disclosed, that other appropriate connection means could be employed. As the electrode 10 is threaded into the holder 16, the outer or peripheral edge of the rear surface 13 of electrode body 12 comes into mounting proximity with an annular electrode holder extension portion 18 which extends from the electrode holder 16 and is coaxially aligned with the mounting hole 16a. The electrode holder extension 18 has at its front surface an O-ring 22 captured by an annular O-ring groove 24 coaxially aligned with the hole 16a and the electrode 10. As the stud end 14b is further threaded into the mounting hole 16a, the O-ring 22 is uniformly compressed between the front surface of the O-ring groove 24 and the rear surface 13 of the electrode body 12, forming a fluid-tight seal therebetween. The seal prevents liquid coolant used for cooling the electrode 10 (as hereinafter described in more detail) from entering the deposition chamber. Notches 24a formed in the inner edge of the O-ring groove 24 allow liquid coolant to flow to and directly contact the O-ring 22 so that it may be maintained at a temperature that allows it to have a longer useful life in the deposition machine.

The electrode holder extension 18, in combination with the rear surface 13 of the electrode body 12, defines an annular cavity or passage 30 about the stud 14. An inlet coolant passageway 28 is formed in the electrode holder 16 and extends from an inlet external port 28a located external of the deposition chamber to an inlet internal port 28b opening into the cavity 30. An outlet coolant passageway 29 is formed in the electrode holder 16 and extends from an outlet external port 29a located external of the deposition chamber to an outlet internal port 29b opening into the cavity 30. A pair of coolant tubes 25a and 26 are connected to external inlet port 28a and to external outlet port 29a, respectively for carrying liquid coolant to and from inlet coolant passageway 28 and outlet coolant passageway 29 respectively, as further discussed below. The coolant is provided from an appropriate coolant source, not illustrated.

The electrode assembly 17 further includes means for providing electrical contact with a power supply so that the electric body 12 can be properly electrically biased. In this regard, the electrode holder 16 includes a boss 52 which is bored to accommodate a power supply plug 32 which is connected to an external electrical power supply (not shown).

In the preferred construction of the invention, a permanent ring magnet 38 annularly surrounds the boss 52. As is known in the art, such magnets provide a magnetic field at the front surface 11 of the electrode body 12 when mounted as shown in FIG. 4, for controlling movement of the cathode spot(s) on the front surface 11 of the electrode body 12. An electromagnet could also be used in lieu of the permanent magnet 38 illustrated, as well known in the electric arc vapor deposition art. In the preferred construction, a cover 40, preferably made of sheet metal, retains the magnet 38. An adhesive, preferably an epoxy, is used to hold the cover 40 in place.

The entire electrode assembly 17 is supported in operative position within the deposition chamber by a source plate ring 20 which is ultimately supported by a wall of the deposition chamber (not shown). The electrode holder extension 18 is configured to extend through an opening 20a in the source plate ring 20 such that the electrode body 12 is exposed to the inner vacuum chamber of the deposition chamber. The rear portion (i.e. the boss 52 and the plate portion 40) of the assembly when mounted to a deposition chamber forms a portion of the outer wall of the chamber. The electrode assembly 17 is preferably electrically isolated from the source plate ring (i.e. from the deposition chamber housing), however, by an insulator ring 34. The insulator ring 34 is preferably constructed of a resilient and electrical insulator material so that electrical isolation between electrode assembly 17 and source plate ring 20 may be maintained. The ring seal 34 also provides a vacuum seal between the electrode assembly 17 and the source plate ring 20, as described below.

The source plate ring 20 and the electrode holder 16 are compressed together by a plurality of clamps 36 which are preferably threadedly engaged (not shown) with the source plate ring 20. As the clamps 36 are tightened, the electrode holder 16 and the source plate ring 20 are forced together, thus squeezing the insulator ring 34 therebetween and effecting a seal.

The operation of the electrode assembly 17 in an electric arc vapor deposition machine can now be described. Typically, the electrode assembly 17, including the electrode 10, is electrically negatively biased with respect to the chamber wall (not shown) through the use of a power supply (not shown) connected to the electrode assembly 17 through the power supply plug 32. When so biased, the electrode 10 is termed the cathode of the system, and the chamber wall often becomes the anode of the electric arc circuit.

A trigger member, generally designated at 42, initiates an electric arc between the cathode and anode, which arc "vaporizes" the electrode body 12. The vapor forms a plasma of the coating source or cathode material. The trigger member 42 is movably controlled by a trigger actuating mechanism (not illustrated) and is supported by the source plate ring 20 or chamber wall, as is well known to those skilled in the art of electric arc vapor deposition. An electrical power supply (not shown) biases the trigger member 42 positively with respect to the electrode 10. The electrode 10 is thus negatively biased with respect to the trigger member 42. The trigger member 42 is moved into physical contact with the electrode body 12, establishing an electrical circuit and current flow between the anode and the cathode and through the trigger member 42. When the trigger member 42 is removed from cathode surface 11, an electric arc(s) is struck therebetween. Once the arc is initiated, the trigger member 42 is electrically removed from the circuit, as is well-known, and the arcs are maintained between the electrode body 12 and the anode. The termination of an electric arc on the cathode surface 11 forms a visible spot, referred to as a cathode spot. The energy of the electric arcs cause the source material to vaporize at the cathode spots, to form the coating plasma.

During the deposition process the electrode 10 is cooled by a liquid coolant being pumped through the annular space 30. Water is an adequate coolant. The water is carried to the reservoir 30 by the hose 26 and passageway 28 and is carried away through passageway 29 and the second hose 25. Also, during the deposition process the magnet 38 helps to control movement of the cathode spots to provide uniform erosion of the electrode body 12.

As the coating process proceeds, the electrode body 12 "erodes," its material being coated upon the substrate(s) within the deposition chamber. When the electrode body 12 becomes eroded to the point that it needs replacing, the operator simply replaces the spent electrode 10 from the chamber wall by turning the electrode body 12 so as to unscrew the threaded stud 14 from the electrode holder 16, thus disengaging the electrode 10 from the electrode holder 16. It should be noted that although the same loosening torque may be applied to the cathode 12 and the prior art device as shown in FIG. 3, the amount of force that this same amount of torque generates on the threads in the presently invented device is much greater so that it may be more easily unscrewed even after several runs. A new electrode body 12, preferably having its own threaded stud 14, is then simply screwed into the electrode holder 16 and the refurbished electrode assembly 17 is ready for operation.

Numerous characteristics and advantages of the invention have been set forth in the foregoing detailed description. It will be understood, of course, that this disclosure is in many respects only illustrative. Other modifications of the invention will become apparent to those skilled in the art in light of the foregoing description. This description is intended to provide specific examples of an embodiment which clearly distinguish and disclose the present invention. Accordingly, the invention is not limited to the described embodiment, or to the use of specific elements or techniques described herein. Changes may be made in details, particularly in matters of shape, size, and arrangement of parts without exceeding the scope of the invention. The scope of the invention is defined in the language in which the appended claims are expressed.

I claim:

1. A consumable electrode adapted for use as a coating source in an electric arc physical vapor deposition machine of the type having, means for holding said electrode and means for sealingly engaging said electrode, said electrode comprising:

(a) a body of consumable coating source material generally disposed about a longitudinal axis and having a front surface, a rear surface opposite said front surface, a broad rear central portion proximate to said longitudinal axis at said rear surface, and a periphery near the outer edge of said rear surface, said periphery adapted to be sealingly engaged by said engaging means; and (b) means operatively connecting said rear central portion of said body to said holding means for applying rearward tension to said body in a direction substantially parallel to said longitudinal axis of said body; wherein said rearward tension places said body periphery in sealing engagement with said engaging means so as to define a sealed coolant cavity that extends below substantially the entire said rear surface of said body when said body is operatively connected to said holding means, whereby substantially the entire rear surface of said body is directly cooled.

2. The electrode as recited in claim 1, wherein said body comprises a metallic material suitable for vaporization within an electric arc vapor deposition machine.

3. The electrode as recited in claim 2, wherein said body comprises titanium.

4. The electrode as recited in claim 1, wherein said connecting means comprises a stud having a first end and a second end, said stud being substantially coaxial with said longitudinal axis.

5. The electrode as recited in claim 4, wherein said stud is externally threaded on said first and second stud ends, wherein said holding means forms a first internally threaded hole adapted to threadedly engage said first end of said stud, and wherein said body forms a second internally threaded hole adapted to threadedly engage said second end of said stud.

6. The electrode as recited in claim 4, wherein said stud comprises an electrically conductive material.

7. The electrode as recited in claim 1, wherein said front surface of said body is substantially planar and wherein said body is substantially cylindrically disposed about said longitudinal axis.

8. A first electrode assembly adapted for use in an electric arc vapor deposition chamber of the type having a second electrode, said first electrode assembly comprising:
 (a) a body of consumable electrode material suitable for use as a coating source, said body being disposed about a longitudinal axis and having: a front surface, a rear surface opposite said front surface, a rear central portion proximate to said longitudinal axis at said rear surface, and a periphery near the outer edge of said rear surface, and adapted to be sealingly engaged;
 (b) means cooperatively sealingly engaging said periphery of said body for forming a uniform fluid tight pressure contact seal with said periphery;
 (c) means for holding said body; and
 (d) means operatively connecting said rear central portion of said body to said holding means, for applying rearward tension to said body in a direction substantially parallel to said longitudinal axis; wherein said rearward tension uniformly draws said body periphery into pressure contact sealing engagement with said engaging means when said body is operatively connected to said holding means, so as to define a sealed coolant cavity that extends below and permits active direct cooling of substantially the entire rear surface of said body.

9. The first electrode assembly as recited in claim 8 wherein said body comprises a metallic material suitable for conducting electric current and for vaporizing to a coating plasma within the electric arc vapor deposition machine.

10. The first electrode assembly as recited in claim 8, wherein said connecting means comprises a stud having a first end and a second end, said stud being substantially coaxial with said longitudinal axis.

11. The first electrode assembly as recited in claim 10, wherein said stud has male threads on said first and second stud ends, wherein said holding means forms a first female threaded hole adapted to threadingly engage said first end of said stud, and wherein said body forms a second female threaded hole adapted to threadingly engage said second end of said stud.

12. The first electrode assembly as recited in claim 8, wherein said body is substantial cylindrically shaped about said longitudinal axis, and wherein said front surface is substantially planar.

13. The first electrode assembly as recited in claim 8, wherein said vapor deposition chamber includes means for biasing said second electrode as an anode of the chamber and wherein said first electrode assembly further includes means for electrically biasing said body as a cathode of the chamber and more negatively than said second electrode.

14. An electrode assembly for an electric arc vapor deposition chamber, comprising:
 (a) consumable cathode comprising an electrode body of conductive coating source material, being generally symmetrically disposed about a longitudinal axis and having a front surface from which coating source material is vaporized, a rear surface opposite said front surface, a rear central portion on said rear surface and proximate said longitudinal axis, and a periphery near the outer edge of said rear surface;
 (b) means for mounting said cathode within a vapor deposition chamber, comprising:
  (i) support means for cooperatively engaging said cathode along said periphery thereof; and
  (ii) connecting means operatively mounted to said rear central portion of said cathode for axially urging said cathode periphery toward uniform cooperative engagement with said support means; and
 (c) seal means operatively connected between said support means and said cathode periphery for forming a fluid tight seal therebetween; wherein a liquid holding coolant cavity is peripherally defined by said seal means and below substantially the entire said rear surface of said cathode for directly actively cooling said cathode.

15. An electrode assembly as recited in claim 14, wherein said support means comprises an annularly shaped seat arranged and configured to cooperatively engage said cathode periphery.

16. An electrode assembly as recited in claim 15, wherein said seal means includes an O-ring seal.

17. An electrode assembly as recited in claim 16, wherein said seat defines a groove configured to cooperatively address said periphery of said cathode; and wherein said O-ring seal is operatively mounted within said groove.

18. An electrode assembly as recited in claim 17, further including cooling means operatively connected with said mounting means and including in part said sealed coolant cavity for cooling said cathode when operatively mounted to said mounting means; said cooling means being adapted to carry a liquid coolant.

19. An electrode assembly as recited in claim 18, wherein said cooling means is configured to directly actively cool said rear surface of said cathode with said liquid coolant.

20. An electrode assembly as recited in claim 19, wherein said support means defines a liquid coolant reservoir for carrying said liquid coolant; and further including means for directly cooling said seal means with said liquid coolant from said reservoir.

21. An electrode assembly as recited in claim 20, wherein said O-ring groove comprises an inner annular wall and an outer annular wall, said walls being concentrically disposed with respect to one another with the radius of said inner wall being less than the radius of said outer wall; wherein said inner wall forms a plurality of notches, wherein said plurality of notches open into said liquid coolant reservoir to allow fluid communication between said groove and said reservoir.

22. An electrode assembly as recited in claim 14, further including cooling means operatively connected with said mounting means for cooling said cathode when operativley mounted to said mounting means; said cooling means being adapted to carry a liquid coolant.

23. An electrode assembly as recited in claim 22, wherein said cooling means is operatively connected to directly cool said rear surface of said cathode with said liquid coolant.

24. An electrode assembly as recited in claim 23, wherein said support means defines a liquid coolant reservoir for carrying said liquid coolant; and further including means for directly cooling said seal means with said liquid coolant from said reservoir.

25. An electrode assembly as recited in claim 14, wherein said cathode comprises titanium.

* * * * *